US006776852B2

(12) United States Patent
Boyko et al.

(10) Patent No.: US 6,776,852 B2
(45) Date of Patent: Aug. 17, 2004

(54) PROCESS OF REMOVING HOLEFILL RESIDUE FROM A METALLIC SURFACE OF AN ELECTRONIC SUBSTRATE

(75) Inventors: Christina M. Boyko, Endicott, NY (US); Brian E. Curcio, Binghamton, NY (US); Donald S. Farquhar, Endicott, NY (US); Michael Wozniak, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 10/046,621

(22) Filed: Jan. 14, 2002

(65) Prior Publication Data

US 2003/0131870 A1 Jul. 17, 2003

(51) Int. Cl.[7] ................................................ B08B 3/00
(52) U.S. Cl. ................................ 134/28; 134/2; 134/6; 134/26; 216/38; 216/39; 216/52; 438/690; 438/691; 438/692; 438/693; 438/906
(58) Field of Search ............................ 134/2, 6, 26, 28; 216/38, 39, 52; 438/690–693, 906

(56) References Cited

U.S. PATENT DOCUMENTS

| 4,383,867 | A | * | 5/1983 | Elwell, Jr. ................... 106/311 |
|---|---|---|---|---|
| 4,515,829 | A | * | 5/1985 | Deckert et al. ............... 427/97 |
| 4,597,988 | A | * | 7/1986 | Kukanskis et al. ........... 427/97 |
| 4,756,930 | A | * | 7/1988 | Kukanskis et al. ........... 427/97 |
| 4,888,450 | A | * | 12/1989 | Lando et al. ................ 174/256 |
| 5,132,038 | A | * | 7/1992 | Kukanskis et al. ......... 510/175 |
| 5,311,660 | A | * | 5/1994 | Alpaugh et al. ............... 29/852 |
| 5,738,127 | A | | 4/1998 | Heymanns et al. |
| 5,759,427 | A | | 6/1998 | Cibulsky et al. |
| 5,822,856 | A | | 10/1998 | Bhatt et al. |
| 5,916,736 | A | * | 6/1999 | Doi et al. .................... 430/318 |
| 5,980,643 | A | | 11/1999 | Jolley |
| 6,015,520 | A | | 1/2000 | Appelt et al. |
| 6,123,088 | A | | 9/2000 | Ho |
| 6,125,531 | A | | 10/2000 | Farquhar et al. |
| 6,140,286 | A | | 10/2000 | Watanabe et al. |
| 6,177,490 | B1 | * | 1/2001 | Yoda et al. .................. 523/457 |
| 6,537,608 | B2 | * | 3/2003 | Miller et al. ................... 427/97 |
| 6,564,451 | B2 | * | 5/2003 | Abe et al. ...................... 29/830 |
| 2002/0062990 | A1 | * | 5/2002 | Kikuchi et al. ............. 174/264 |
| 2002/0082349 | A1 | * | 6/2002 | Takahashi et al. .......... 525/107 |

FOREIGN PATENT DOCUMENTS

JP  2-189993  * 7/1990

* cited by examiner

Primary Examiner—M. Kornakov
(74) Attorney, Agent, or Firm—Scully, Scott, Murphy, Presser; William H. Steinberg

(57) ABSTRACT

A process of removing excess holefill material from a surface of an electronic substrate in which the holefill residue is contacted with a swelling agent followed by planarizing of the surface in the presence of an agent no stronger than a liquid having a pH of about 6 to about 8.

15 Claims, 1 Drawing Sheet

US 6,776,852 B2

PROCESS OF REMOVING HOLEFILL RESIDUE FROM A METALLIC SURFACE OF AN ELECTRONIC SUBSTRATE

BACKGROUND OF THE DISCLOSURE

1. Field of the Invention

The present invention is directed to a process of removing holefill residue from a metallic or dielectric surface of an electronic substrate. More specifically, the present invention is directed to a process for removing holefill residue from a metallic or dielectric surface of an electronic substrate by exposing the residue to a swelling agent followed by planarizing.

2. Background of the Prior Art

Printed wiring boards (PWBs), such as printed circuit boards, chip carriers or multichip modules, are well known examples of electronic substrates. PWBs usually comprise layers of conductive and dielectric materials laminated together. Some of the layers include conductors or signal lines, prepared by methods well known in the art, on a dielectric layer and other layers may comprise a sheet of metal laminated, plated or evaporated onto the dielectric layer to serve as a ground or power plane. Typically, a surface layer includes printed conductors, metallic pads and components mounted to the pads. The components may include resistors, capacitors, amplifiers, processor chips, memory chips, application specific integrated circuits, optical devices and the like. Also, such components could be any of the foregoing electronic devices mounted on a carrier, the carrier being mounted onto the PWB. Some of the printed conductors on the surface layer connect to pads and thereby participate in electrically connecting the respective components to other components, power and ground. However, because of surface area limitations, the surface layer may not be able to accommodate all the printed conductors that are required. Therefore, plated through holes (PTHs) and blind vias are also provided by drilling, punching or ablating in the PWB and subsequent deposition of a conductive material in the hole to interconnect printed conductors on the surface layer to printed conductors or metallic planes on inner layers. Some of these printed conductors are also connected to surface pads to which components are mounted. Thus, the printed conductors and metallic planes on the inner layers also participate in connections to the components on the surface layer.

It is particularly desirable that the PTHs and blind vias ultimately be filled and overplated or capped in order to increase the mechanical strength of the PWB, to provide electrical conductivity over the complete surface of the PWB and, in general, to increase the useable space of the PTH. The resulting structure provides for the option of attaching an electronic component directly over the capped hole, rather than requiring the use of the typical so-called dogbone type connection wherein a component is attached to a conductive pad that is adjacent to a conventional plated through hole and connected with a dogbone connection. Elimination of the need for a dogbone connection results in a significant increase in possible wiring density on the surface of the printed wiring board of the chip carrier. Especially in the case of a chip carrier, where a dense area array of solder interconnections to the chip is required, the ability to directly attach a plurality of the solder interconnections directly above a capped plated through hole or blind via is advantageous.

While improving the possible interconnection density, the use of filled and capped plated through holes have other advantages. The material that fills the holes may have a range of mechanical and electrical properties, depending upon its formulation. In general, the holefill material is a polymer mixture that has various fillers added to tailor its properties. For example, the thermal expansion rate of the material can be reduced by added low expansion particles such as copper particles or silica particles. If a sufficient number of electrically conducting particles are added, then the mixture will be conductive. Conductivity can be achieved when the volume fraction of particles is sufficient to ensure that there is a continuous path through the material. The conductive path may be occur by particle to particle physical contact or it may be occur due to alloying of adjacent particles during the heating process that cures the polymer matrix.

Depending upon the physical and mechanical characteristics of the printed wiring board, a plated through hole is subjected to some thermally induced stress due to the inevitable heating and cooling that occurs in electronic components during their service life. By selecting a holefill material with the correct characteristics, the stresses imparted upon the plated through hole may be diminished, thus improving its reliability. In the event that the holefill material is electrically conductive a greater robustness can be achieved by virtue of the alternate current path that is provided in the event that the metallic plating is thin or becomes defective during its service life.

A further extension of the use of electrically conductive holefill material to augment metallic hole wall plating is the complete elimination of metallic plating and use only of the conductive hole fill material. Such a design provides significant opportunity for cost reduction and simplicity by eliminating the need for plating the sidewalls of the hole and thereby eliminating processing steps. In this process the sidewalls of the holes are not plated prior to filling the holes with a conductive material. The outer surface of the partially completed printed wiring board requires a conductive layer to form individual printed conductors that connect to the conductive holes. This outer conductive surface may be provided either before or after the hole filling process is conducted.

Materials employed in filling PTHs and blind vias are usually organic materials with metallic or inorganic fillers. The filling of PTHs is described in U.S. Pat. No. 5,822,856. Improved methods of filling PTHs and blind vias in PWBs are also set forth in U.S. Pat. No. 6,015,520. In addition, U.S. Pat. No. 6,125,531 discusses methods of making PCBs having filled holes and wherein the holefill is provided with reinforcement means.

There are many methods of filling PTHs and blind vias in electronic substrates such as PWBs. For example, such holes are often filled by utilization of a doctor blade. In this method PTHs and blind vias are filled and smoothed over with the holefill material. Unfortunately, these methods result in residual holefill which overlaps the surface of the PWB. As mentioned above, the surface of the PWB at this step of the fabrication process may be either a dielectric material or a conductive metal. Thus, it is necessary to planarize the overfilled PTHs and blind vias without damaging the outer surface of the PWB. Although polishing of metal surfaces of electronic substrates and, indeed, the planarizing of metal circuitry on PWBs is well known in the art and is excellently accomplished with metal etchants, as taught, for instance, in U.S. Pat. No. 5,759,427, such a method is undesirable in the present application. This is so insofar as the removal of metal, commonly copper, from the surface of a PWB or the like may in some instances be deemed detrimental. For example, a layer of copper, thinner than desired, results in a PWB having adverse electrical properties. Thus, the present method of removing holefill by utilizing mild chemical etching, which removes metal as well as holefill, is undesirable. Therefore, there is a strong need in the art for a new process of removing the excess holefill over PTHs and blind vias on PWBs and other electronic substrates having a metallic or dielectric surface which removes excess holefill and insures a planarized surface without the loss of metal thickness.

BRIEF SUMMARY OF THE INVENTION

A new process for removing holefill residue from a metallic or dielectric surface of an electronic substrate has now been developed. This process planarizes the metallic or dielectric surface of the electronic substrate without any appreciable removal of metal or dielectric material from the metal or dielectric surface.

In accordance with the present invention a process is provided for removing holefill residue from a metallic or dielectric surface of an electronic substrate which comprises the steps of contacting holefill residue on a surface of a metallic or dielectric surface of an electronic substrate with a swelling agent and thereafter mechanically planarizing the surface contacted with the swelling agent.

BRIEF DESCRIPTION OF THE DRAWINGS

The present invention may be better understood by reference to the following drawings of which.

DETAILED DESCRIPTION

Figure 1:
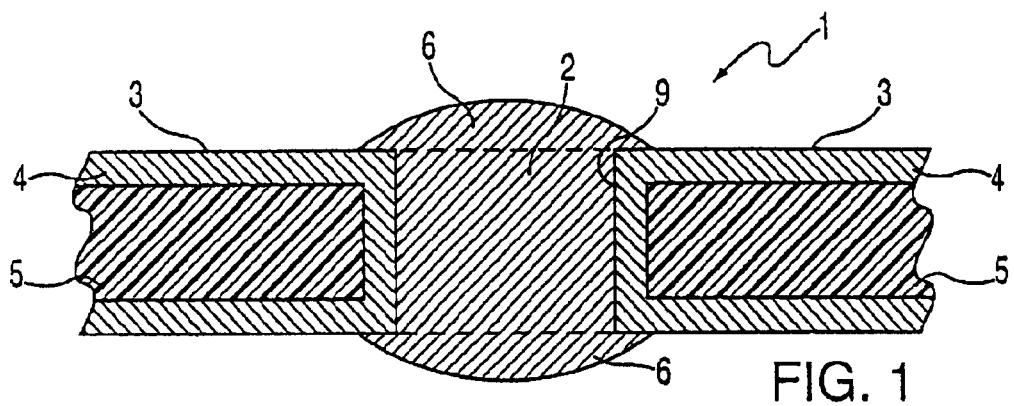
FIG. 1 is a schematic representation of an electronic substrate in which a hole is filled with holefill such that there is holefill residue.

The process of the present invention is directed to the removal of holefill residue from a metallic or dielectric surface of an electronic substrate. Electronic substrates within the scope of the present invention include printed wiring boards (PWBs), such as printed surface boards, chip carriers and multichip modules. Indeed, electronic substrates within the contemplation of the present invention include any electronic substrate having a metallic or dielectric surface which includes at least one or more holes. These holes, such as plated through holes (PTHs) and blind vias, are within the contemplation of the present invention. These holes, i.e. PTHs and blind vias, may be provided by drilling, punching or ablating.

Holes, such as PTHs and blind vias, disposed on an electronic substrate may be filled in order to provide mechanical reinforcement, electrical conductivity and increased usable space. The holefill material is typically an organic material which may include electroconductive particles, i.e. a metal or carbon particles, especially copper and/or silver particles, to form an organic-based conductive material. Alternatively, the organic material may be filled with thermoconductive dielectric particles to improve thermal performance and provide mechanical reinforcement.

The organic material may be a thermosetting or a thermoplastic resin. In a preferred embodiment the resin is an epoxy or silicone adhesive. Thus, such commercially available electroconductive adhesives such as DuPont® CB 100; Ablestick® 8175; and Honeywell® Vf 3200 are usefully employed in filling PTHs and blind vias. These adhesives are all metal filled thermosetting epoxy resins. A suitable solvent, such as methyl ethyl ketone, may be added to the organic material to achieve suitable viscosity. In many applications, where a thermosetting resin is utilized, a catalyst may be added to expedite curing. For example, a tertiary amine catalyst is often employed. A typical holefill material, for example, may be about 20% to 30% by wt. phenol cured cresyl-novolac resin filled with 70% to 80% by weight electroconductive particles, such as copper, silver or a mixture thereof. Electrical conductivity is achieved when the particle filler loading is sufficient to provide a continuous conductive path between particles. The particles may be in intimate contact with their neighbors, or they may form metal alloys upon heating to cure the resin.

The holefill material may reach the percolation threshold wherein the particle filler loading is sufficient to provide a continuous electrical conductive path between particles. Such holefill materials may also be utilized even when the percolation threshold is not reached. In such cases the material may provide requisite thermal conductivity. In still other embodiments the holefill material may be provided to lower the coefficient of thermal expansion to approximate the coefficient of thermal expansion of the circuit board.

The operation of the present invention is illustrated by an electronic substrate, generally indicated by reference numeral 1. That typical electronic substrate 1 is a PWB which includes a PTH 9 filled with holefill material 2. The holefill material 2 overlaps the hole 9 and covers small portions of surface 3 of PWB 1. That surface 3 is metallic or dielectric. Preferably, the surface is metallic. In the case where the surface 3 is dielectric, it is foreseeable that a conductive layer would be added in a subsequent processing step. More preferably, the surface is copper. The metallic or dielectric nature of the layer is denoted by reference numeral 4. In accordance with the usual construction of PWBs, portions of surface 3 of PWB 1 are comprised of a dielectric material 5. The dielectric material may be a fiberglass-reinforced epoxy resin, polytetrafluoro ethylene, cyanates, bismaleimide triazines, compositions with epoxy polyimide film and the like. The specific identity of suitable dielectric materials are well known in the art and thus other dielectric materials may be utilized.

In the process of the present invention the holefill residue defined by the outer limits of the holefill and the dotted lines, and indicated in the drawings by reference numeral 6, is removed. To accomplish this task, the excess holefill residue is contacted with a swelling agent. The swelling agent is preferably a polar organic solvent. More preferably, the polar organic solvent is an aprotic solvent. Preferred aprotic solvents include, but are not limited to, di(ethylene glycol) butyl ether, N-methyl pyrrolidine and dimethyl formamide. Although the invention is not limited to any theory explaining its operation, it is theorized that the swelling agent swells and softens the holefill material so that it is easily mechanically planarized and thus removed.

In unusually difficult situations, where a swelling agent does not sufficiently swell and soften the holefill residue, a second contacting agent, an oxidizer, may be applied subsequent to the application of the swelling agent. A strong oxidizing agent is postulated to be effective in breaking chemical bonds of the organic holefill material and thus reducing its molecular weight. In this way holefill residue resistance to removal is diminished. Particularly preferred oxidizers are such oxyanions as a permanganate salt, such as potassium permanganate, or a chromate salt, such as sodium or potassium chromate. Other oxyanions, that is, salts that possess a large standard reduction voltage, may be used in place of the above preferred strong oxidizing salts.

The printed wiring board itself may be somewhat susceptible to the actions of the sweller and the oxidizer and, in fact, such chemical agents are used to remove drill smear from the sidewalls of drilled holes prior to plating them to improve the wettability of the plating solution and the adhesion of the plated metal. In practice, the resistance of the printed wiring board, tends to be greater than the holefill material for several reasons. For high performance printed wiring board, the dielectric materials are typically high glass transition temperature materials with a high level of cross-linking and therefore very resistant to chemical attack. Further, they are cured under significant pressure and temperature, ensuring the absence of voids and defects which would otherwise increase their chemical susceptibility. In contrast, electrically conductive adhesives generally have relatively lower glass transition temperatures due to their requisite lower curing temperatures. Moreover, conductive adhesives, are not typically cured under extreme pressures. In addition, adhesives are typically filled with particles, thus increasing their susceptibility to chemical attack at myriad interfaces. As a result, the use of swelling and oxidizing chemicals is more effective at attacking the holefill residue compared to the printed wiring board itself.

The subsequent step in the process of holefill residue removal is the step of planarizing the metallic or dielectric surface to remove holefill which overlaps the hole. That residue, swollen and softened by treatment with a swelling agent, and optionally, an oxidizing agent, is removed by planarization.

One means of planarizing is the use of a high pressure spray nozzle water wash tool such is commonly used in the printed wiring board industry. Such tools are typically configured so that the board is transported on a horizontal conveyor with spray nozzles positioned above and below the conveyer. Spray impinges at sufficient velocity to remove debris from the surface of the printed wiring board. As an alternative to a water wash spray tool, an abrasive spray tool including an abrasive, such as aluminum oxide particles, suspended in water, is an effective means to remove the holefill residue.

Planarizing by high pressure water spray, which may be augmented by inclusion of abrasive particles, is depicted in the drawings. Therein, high pressure spray 10, spraying water or water and abrasive particles at high pressure, is shown removing holefill 6 which overlaps hole 2.

Another and more preferred method of planarizing to remove holefill residue is to use a mechanical planarizing head in combination with a sweller and oxidizer, if necessary. The resulting uniformity and flatness of the printed wiring board surface is improved. Mechanical planarization is accomplished by methods known in the art. In the drawings, a planarizing head 7 is depicted. It should be understood that planarizing tools well known in the art are employed in this step. Thus, tools of the type disclosed in U.S. Pat. No. 5,759,427, incorporated herein by reference, may be employed in the mechanical planarizing step of the process of the present invention. In a preferred embodiment, a planarizing head operating at a belt speed of 20 inches/min, on a 4 inch diameter drum, spinning at 600 rpm, is utilized.

The novel aspect of this mechanical planarizing step, not described in the prior art, is that no abrasive, chemical etchant or the like need be utilized in the planarizing step. This is because of the action of the swelling agent which may, optionally, be supplemented by an oxidant. Indeed, the mechanical planarizing step of process of the present invention is limited to conducting that step in the presence of a liquid having a pH in the range between about 6 and about 8. It is emphasized, however, that the planarizing apparatus may be provided with abrasive means. More preferably, the lubricant is water. In an alternate preferred embodiment of the present invention, no liquid of any kind is employed in the mechanical planarizing step.

Figure 2A:
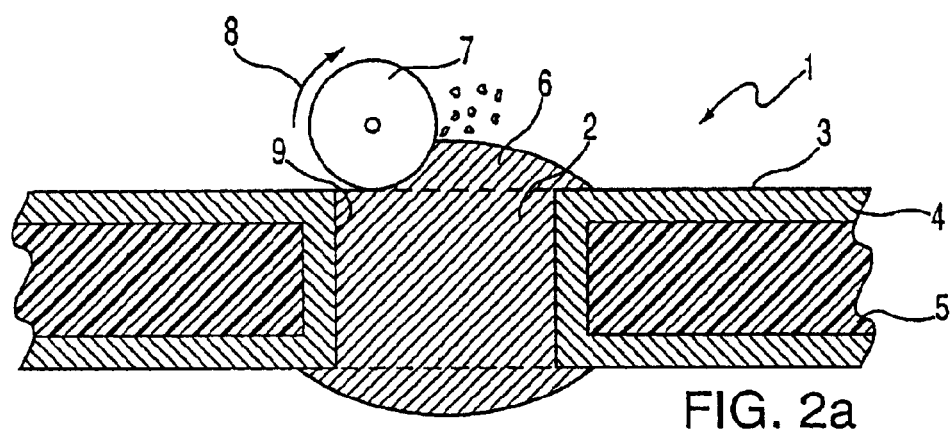
FIG. 2a is a schematic representation of a planarizing step in the removal of holefill residue from a surface of an electronic substrate.
Figure 2B:
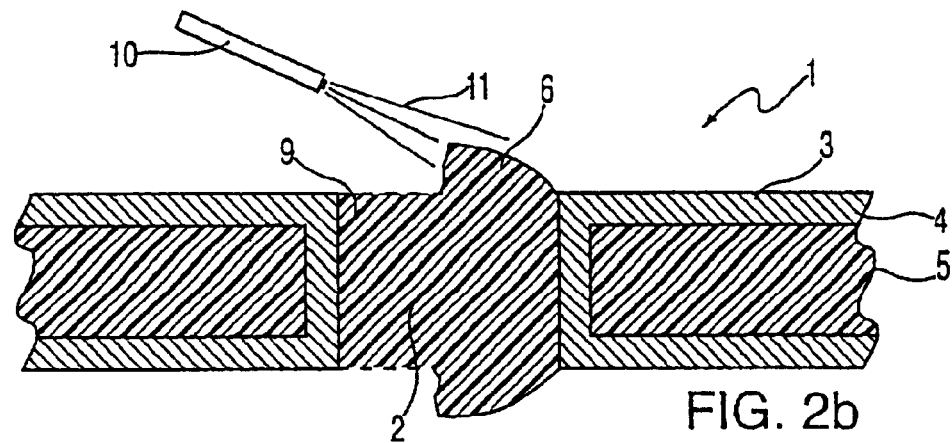
FIG. 2b is a schematic representation of an alternate planarizing step in the removal of holefill residue from a surface of an electronic substrate.
Figure 3:
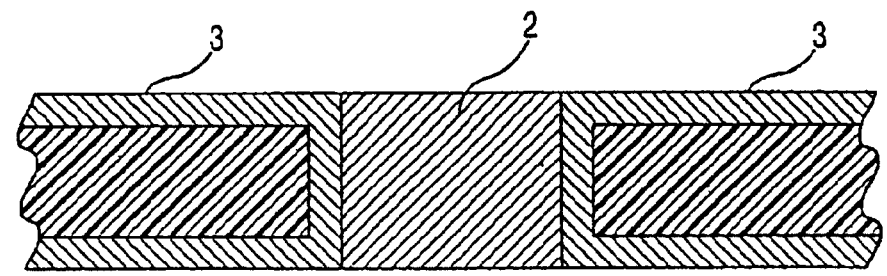
FIG. 3 is a schematic representation of an electronic substrate after the successful practice of the process of the present invention.

A typical application of the process of the present invention is illustrated in FIG. 2. Therein PWB 1 is shown subjected to mechanical planarizing with a planarizing head 7. Specifically, planarizing head 7 is shown rotating in the direction of arrow 8 removing excess holefill 6 that protrudes above surface 3 to planarize holefill 2 of PWB 1. The product of the process of the present application is depicted in FIG. 3 wherein the holefill surface is planarized with the metallic surface 3 of the electronic substrate 1.

The above embodiments are given to illustrate the scope and spirit of the present invention. These embodiments will make apparent to those skilled in the art other embodiments and examples. Those other embodiments and examples are within the contemplation of the present invention. Therefore, the present invention should be limited only by the appended claims.

What is claimed is:

1. A process of removing excess holefill material from a surface of an electronic substrate comprising the step of swelling said excess holefill material by contacting it with a swelling agent followed by the step of planarizing said surface of said substrate in the area contacted with said swelling agent, wherein the swelling agent is an aprotic polar organic solvent.

2. A process in accordance with claim 1 wherein said surface is metallic or dielectric.

3. A process in accordance with claim 2 wherein said surface is metallic.

4. A process in accordance with claim 3 wherein said surface is copper.

5. A process in accordance with claim 1 wherein said aprotic polar organic solvent is selected from the group consisting of di(ethylene glycol) butyl ether, N-methyl pyrrolidine and dimethyl formamide.

6. A process in accordance with claim 1 including the step of contacting said holefill residue, subsequent to contact with said swelling agent, with an oxidizing agent.

7. A process in accordance with claim 6 wherein said oxidizing agent is an oxyanion.

8. A process in accordance with claim 7 wherein said oxyanion is selected from the group consisting of a permanganate salt and a chromate salt.

9. A process in accordance with claim 1 wherein said planarizing step is conducted in the presence of a liquid agent having a pH in the range of between about 6 and about 8.

10. A process in accordance with claim 9 wherein said liquid is water.

11. A process in accordance with claim 1 wherein said planarizing step occurs by mechanical means.

12. A process in accordance with claim 11 wherein said planarizing step utilizes a mechanical planarizing head.

13. A process in accordance with claim 11 wherein said planarizing step is conducted in the absence of any liquid except said swelling agent.

14. A process in accordance with claim 1 wherein said planarizing step occurs by means of a high pressure water spray.

15. A process in accordance with claim 14 wherein said high pressure spray includes abrasive particles.

* * * * *